United States Patent
Schmid et al.

(10) Patent No.: US 9,871,200 B2
(45) Date of Patent: Jan. 16, 2018

(54) SALTS OF CYCLOPENTADIENE AS N-DOPANTS FOR ORGANIC ELECTRONICS

(71) Applicant: SIEMENS AKTIENGESELLSCHAFT, Munich (DE)

(72) Inventors: Guenter Schmid, Hemhofen (DE); Jan Hauke Wemken, Nuremberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 14/431,787

(22) PCT Filed: Sep. 11, 2013

(86) PCT No.: PCT/EP2013/068785
§ 371 (c)(1),
(2) Date: Mar. 27, 2015

(87) PCT Pub. No.: WO2014/048741
PCT Pub. Date: Apr. 3, 2014

(65) Prior Publication Data
US 2015/0243889 A1  Aug. 27, 2015

(30) Foreign Application Priority Data
Sep. 27, 2012  (DE) .......... 10 2012 217 587

(51) Int. Cl.
*H01L 51/00* (2006.01)
*H01L 51/05* (2006.01)
(Continued)

(52) U.S. Cl.
CPC .......... *H01L 51/005* (2013.01); *H01L 51/002* (2013.01); *H01L 51/0077* (2013.01);
(Continued)

(58) Field of Classification Search
None
See application file for complete search history.

(56) References Cited

U.S. PATENT DOCUMENTS 5,811,833 A * 9/1998 Thompson ............. B82Y 10/00
                                              257/103
5,922,396 A   7/1999 Thompson
(Continued)

FOREIGN PATENT DOCUMENTS

CN      1245581 A    2/2000  ............. C09K 11/06
CN    101728485 A    6/2010  ........... C07C 225/35
(Continued)

OTHER PUBLICATIONS

The Periodic Table of the Elements, accessed online at http://sciencenotes.org/wp-content/uploads/2015/09/MutedPeriodicTable.pdf on Jun. 30, 2016; copy attached to the case file as a PDF.*
(Continued)

*Primary Examiner* — Katie L Hammer
(74) *Attorney, Agent, or Firm* — Slayden Grubert Beard PLLC

(57) ABSTRACT

An organic electron transport layer has at least one dopant for increasing the n-conductivity of the organic layer. The dopant is selected from the group of salts of cyclopentadiene compounds according to formula 1, wherein the substituents R1 to R2 are independently selected from the group containing —H, -D, halogen, —CN, —NO2, —OH, amine, ether, thioether, alkyl, cycloalkyl, acrylic, vinyl, allyl, aromatics, fused aromatics and heteroaromatics.

10 Claims, 1 Drawing Sheet

(51) Int. Cl.

| | |
|---|---|
| H01L 51/42 | (2006.01) |
| H01L 51/50 | (2006.01) |
| H01L 51/10 | (2006.01) |
| H01L 51/44 | (2006.01) |
| H01L 51/56 | (2006.01) |

(52) U.S. Cl.
CPC ........ *H01L 51/001* (2013.01); *H01L 51/0545* (2013.01); *H01L 51/0558* (2013.01); *H01L 51/10* (2013.01); *H01L 51/42* (2013.01); *H01L 51/4293* (2013.01); *H01L 51/44* (2013.01); *H01L 51/5076* (2013.01); *H01L 51/5092* (2013.01); *H01L 51/56* (2013.01); *Y02E 10/549* (2013.01); *Y02P 70/521* (2015.11)

(56) References Cited

U.S. PATENT DOCUMENTS

| | | |
|---|---|---|
| 7,151,007 B2 | 12/2006 | Werner et al. |
| 7,417,247 B2 | 8/2008 | Schmid et al. |
| 2005/0061232 A1 | 3/2005 | Werner et al. |
| 2005/0213413 A1 | 9/2005 | Schmid et al. |
| 2005/0230665 A1* | 10/2005 | Thompson ............. C09K 11/06 252/500 |
| 2007/0295941 A1 | 12/2007 | Kahn et al. |
| 2008/0203406 A1 | 8/2008 | He et al. |
| 2009/0212280 A1* | 8/2009 | Werner ................. C09K 11/06 257/40 |
| 2011/0124141 A1 | 5/2011 | Goeoetz et al. |

FOREIGN PATENT DOCUMENTS

| | | |
|---|---|---|
| DE | 102 45 539 A1 | 4/2004 |
| DE | 103 38 406 A1 | 3/2005 |
| DE | 10 2007 020 644 A1 | 11/2008 |
| DE | 10 2012 217 587.3 | 9/2012 |
| WO | PCT/EP2013/068785 | 9/2013 |

OTHER PUBLICATIONS

Huang, J. et al, "Low-Work-Function Surface Formed by Solution-Processed and Thermally Deposited Nanoscale Layers of Cesium Carbonate," *Advanced Functional Materials*, 2007, 00, pp. 1-8.

Wu, C.-I et al., "Electronic structures and electron-injection mechanism of cesium-carbonate-incorporated cathode structures for organic light-emitting devices," *Applied Physics Letters*, 88, pp. 152104-1-152104-3, 2006.

Xiong, T. et al., Cesium hydroxide doped tris-(8-hydroxyquinoline) aluminum as an effective electron injection layer in inverted bottom-emission organic light emitting diodes, *Applied Physics Letters*, 92, pp. 263305-1-263305-3, 2008.

Zhang, R. et al, "Alkali metal salts of pentaphenylcyclopentadienide," *Journal of Organometallic Chemistry*, vol. 229, No. 2, pp. 109-112, DOI: 10.1016/S0022-328X(00)90273-0, XP055082575, Apr. 20, 1982.

Search Report dated Jul. 9, 2013 for corresponding German Patent Application No. 10 2012 217 587.3.

International Search Report dated Oct. 15, 2013 for corresponding International Patent Application No. PCT/EP2013/068785.

Chinese Office Action, Application No. 201380049961.5, 19 pages, dated Aug. 26, 2016.

Chinese Office Action, Application No. 201380049961.5, 15 pages, dated May 12, 2017.

\* cited by examiner

SALTS OF CYCLOPENTADIENE AS N-DOPANTS FOR ORGANIC ELECTRONICS

CROSS REFERENCE TO RELATED APPLICATIONS

This application is based on and hereby claims priority to International Application No. PCT/EP2013/068785 filed on Sep. 11, 2013 and German Application No. 10 2012 217 587.3 filed on Sep. 27, 2012, the contents of which are hereby incorporated by reference.

BACKGROUND

The present invention relates to an organic electron-conducting layer having at least one dopant for increasing the n-conductivity of the organic layer, characterized in that the dopant is selected from the group of the salts of the cyclopentadiene compounds.

Provision of effective organic electronic components in line with market demand requires not only the selection of highly efficient individual components but also the use of production technologies which enable inexpensive mass production. This applies especially to organic components, for example organic light-emitting diodes (OLEDs), the structure of which is shown in schematic form in FIG. 1, organic solar cells, shown in schematic form in FIG. 2, and organic field-effect transistors, shown in FIG. 3, the composition of which in the last few years has been subject to change directed to ever higher performance.

A key point in the development work for increasing efficiency is the establishment of a higher component quality, which can be achieved substantially through an increase in the charge carrier mobility and density within the organic electronic transport layers used.

There are basically two different approaches pursued in organic electronics to increase the electron conductivity. Firstly, an increase in the charge carrier injection can result from insertion of an intermediate layer between the cathode and electron transport layer. Secondly, an increase in the charge carrier density can be achieved by the n-doping of electrically conductive organic matrix materials with suitable donors. In this case, the matrix material is deposited as a layer together with the dopant either by co-sublimation from the gas phase or from a liquid phase.

For the former method, thin salt layers of LiF, CsF or, in the more recent literature, cesium carbonate are often used, these lowering the work function of the electrons. The properties and effects of cesium carbonate are described, for example, by Huang, Jinsong et al., Adv. Funct. Mater. 2007, 00, 1-8; Wu, Chih-I et al., APPLIED PHYSICS LETTERS 88, 152104 (2006) and Xiong, Tao et al., APPLIED PHYSICS LETTERS 92, 263305 (2008). These intermediate layers significantly improve electron transport, but this improvement is insufficient for high-efficiency layers.

For doping of electronic transport layers, it is generally the case that substances having a HOMO (highest occupied molecular orbital) above the LUMO (lowest unoccupied molecular orbital) of the matrix material are used. This is a prerequisite for transfer of an electron from the dopant to the matrix material and thus for an increase in its conductivity. In addition, preference is further given to introducing substances whose valence electrons have very low work functions or ionization energies. This too can facilitate the electron release of the dopant and thus increase the layer conductivity.

A way of doping organic semiconductor materials proposed, for example, by DE 103 38 406 A1 is that of electrically uncharged compounds having specific geometry, with elimination of hydrogen, carbon oxide, nitrogen or hydroxy radicals after the dopant has been mixed into the organic semiconductor material, and transfer of at least one electron to or from the semiconductor material. These compounds are characterized in that the dopant used is an uncharged organic compound. Example compounds mentioned are substituted and unsubstituted homo- or heterocycles which form an aromatic 6-π system through release or acceptance of an electron. A disadvantage of this solution is that the conditions on the matrix material for elimination of a hydrogen radical from the dopant are very restrictive, and are fulfilled extremely rarely with the matrix materials commonly used in organic electronics. In addition, for example, the hydrogen radicals that form are extremely reactive, which can lead to uncontrolled reactions and ultimately to damage to the layer or the component.

U.S. Pat. No. 5,922,396 A describes a method for producing a multilayer structure for organic electronics, containing both n(electron)-conductive and p(hole)-conductive layers. The multilayer construct is obtained inter alia by sublimation of organic metal complexes which form free radicals in the gas phase and are then deposited in this form as an electron-conducting layer.

SUMMARY

One potential goal is providing organic layers which are suitable for use in organic electronics, have improved electrical properties compared to the related art and can additionally be produced in a simple and inexpensive manner.

The inventors propose an organic electron-conducting layer having at least one dopant for increasing the n-conductivity of the organic layer, characterized in that the dopant is selected from the group of the salts of the cyclopentadiene compounds of formula 1

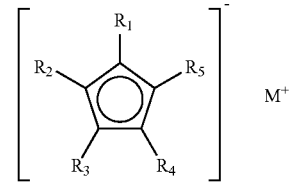

(formula 1)

where the substituents $R_1$ to $R_5$ are each independently selected from the group comprising —H, -D, halogen, —CN, $NO_2$, —OH, amine, ether, thioether, alkyl, cycloalkyl, acryloyl, vinyl, allyl, aromatics, fused aromatics and heteroaromatics. As a result of the chemical properties, the cyclopentadiene derivative is first of all incorporated into the electron-conducting layer as anion and can, without being bound by the theory, release an electron to the matrix material by the following mechanism:

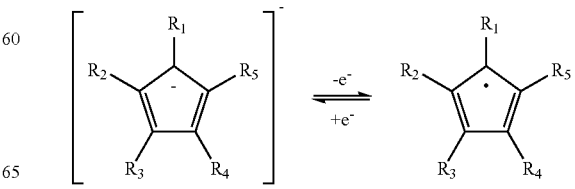

and hence contribute to increasing the charge carrier density within the layer. The cyclopentadiene anions, just like the radicals, are resonance-stabilized and therefore very chemically stable. The redox reaction takes place spontaneously and does not lead to any unwanted by-products. No elimination of hydrogen radicals can be observed on incorporation of the dopants into electron transport materials, nor is it in accordance with the proposal, since hydrogen radicals or conversion products thereof or hydrogen molecules which recombine therefrom can damage the components. The substitution pattern results in advantageous HOMO/LUMO positions of the dopant in relation to electron transport materials known from the related art.

The metal cation $M^+$ from formula 1 may be selected from the group of the alkali metals, alkaline earth metals, main group metals, transition group metals, lanthanoid metals and transition metals. Particular preference is given to the metals from the abovementioned groups which, in salt-type compounds, form stable, singly positively charged cations. This group of cations in conjunction with the cyclopentadiene compounds leads to reproducibly and easily evaporable compounds which form homogeneous layers with the electron transport materials, which is advantageous in relation to the reproducibility and quality of the resulting layers.

The individual substituents $R_1$ to $R_5$ may independently be selected from the group comprising —H, -D, halogen, —CN, —NO$_2$, —OH, amine, ether, thioether, alkyl, cycloalkyl, acryloyl, vinyl, allyl, aromatics, fused aromatics and heteroaromatics. Unless it is common knowledge to the person skilled in the art, the substituents may especially be understood to mean the following:
Halogen: Cl, F
Alkyl: linear or branched C1 to C5 alkyl
Cycloalkyl: C3-C8 cycloalkyl
Fused aromatics: C10-C40 aromatic
Heteroaromatics: C3-C20 with the heteroatoms N, O The substituents $R_1$ to $R_5$ may additionally have substituted or unsubstituted heterocycles at any bonding-capable site in their base structure. Preferably, the substituents may be selected from substituted and unsubstituted heterocycles, for example furan, thiophene, pyrrole, oxazole, thiazole, imidazole, isoxazole, isothiazole, pyrazole, pyridine, pyrazine, pyrimidine, 1,3,6-triazine, pyrylium, alpha-pyrone, gamma-pyrone, benzofuran, benzothiophene, indole, 2H-isoindole, benzothiazole, 2-benzothiophene, 1H-benzimidazole, 1H-benzotriazole, 1,3-benzoxazole, 2-benzofuran, 7H-purine, quinoline, isoquinoline, quinazoline, quinoxaline, phthalazine, 1,2,4-benzotriazine, pyrido pyrimidine, pyrido pyrimidine, pteridine, acridine, phenazine, benzo pteridine, 9H-carbazole and bipyridine, and derivatives thereof.

Electron transport materials to take on electrons and transport them further are known in the related art, and preferred materials may be selected from the group comprising 2,2',2"-(1,3,5-benzenetriyl)tris(1-phenyl-1H-benzimidazole), 2-(4-biphenylyl)-5-(4-tert-butylphenyl)-1,3,4-oxadiazole; 2,9-dimethyl-4,7-diphenyl-1,10-phenanthroline (BCP), 8-hydroxy-quinolinolatolithium; 4-(naphthalen-1-yl)-3,5-diphenyl-4H-1,2,4-triazole; 1,3-bis benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)-aluminum; 6,6'-bis-2,2'-bipyridyl; 2-phenyl-9,10-di(naphthalen-2-yl)anthracene; 2,7-bis-9,9-dimethylfluorene; 1,3-bis benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)-borane; 1-methyl-2-(4-(naphthalen-2-yl)phenyl)-1H-imidazo phenanthroline; phenyldipyrenylphosphine oxide; naphthalenetetracarboxylic dianhydride or imides thereof; perylenetetracarboxylic dianhydride or imides thereof; materials based on siloles, having a silacyclopentadiene unit or further heterocycles, as described in EP 2 092 041 B1.

In a further aspect of the proposal, the organic electron-conducting layer may comprise a dopant, in which case the dopant is selected from the group of the unsubstituted or substituted pentaarylcyclopentadiene salts. The pentaarylcyclopentadiene salts in particular give, because of their substitution pattern on cyclopentadiene, a particularly preferred steric symmetry which allows simple sublimation of the compound. In addition, the HOMO/LUMO ratio between pentaarylcyclopentadiene anion and matrix material is such that a highly effective electron release can be obtained. Without being bound by the theory, this is probably a result of the marked resonance stabilization over the entire aromatic unit. The aryl components may additionally bear further substituents as detailed further up at any substitutable position in their ring structure.

In a further aspect, the organic electron-conducting layer may contain a metal cation $M^+$ selected from the group of the alkali metals comprising lithium, sodium, potassium, rubidium and cesium. This selection may be particularly advantageous since the solubility of the alkali metals in the matrix material is better compared to that of the other metals. In combination with the anions, this may lead to a particularly homogeneous distribution within the layer and hence to a homogeneous layer structure overall.

In a particular embodiment, the organic electron-conducting layer may contain a metal cation $M^+$ selected from the group of the heavy alkali metals comprising rubidium and cesium. This selection may be particularly advantageous since the solubility of the heavy alkali metals in particular in the matrix material is better compared to that of the other alkali metals and of the light alkali metals. In addition, the heavy representatives of the alkali metals can lead to compounds which have particularly good evaporability because of the size of the metal cation.

In a particular embodiment, the dopant present within the electron-conducting electrical layer may be cesium or rubidium pentaarylcyclopentadienide. Additionally particularly preferred is the use of cesium pentaarylcyclo-pentadienide.

In a further embodiment, the organic portion of the dopant may be present within the organic electron-conducting layer with an oxidation number of greater than or equal to −1 and less than or equal to 0. It has been found that, surprisingly, layers including dopants having this redox range of the anion are longer-lived. There is no further oxidation of the organic compound within the matrix material. It is likewise possible to adjust the optical absorption properties of the dopant and hence also of the layer through the selection of suitable ligands.

In addition, the organic electron-conducting layer can be applied to a component by a solvent or sublimation process. The compounds can be evaporated easily without any change in structure, and form very homogeneous layers together with the matrix material via a sublimation or solvent process. This is extremely advantageous for a reproducible layer thickness and can contribute to prolonged component service lives.

In addition, in a particular embodiment, the salts of the cyclopentadiene compounds having a molecular weight greater than or equal to 175 g/mol and less than or equal to 2000 g/mol and having sublimation temperatures greater than or equal to 120° C. and less than or equal to 600° C. may be present in the organic electron-conducting layer. Without being bound to the theory, this molecular mass range enables a sufficient size of the substituents in order to achieve sufficient resonance stabilization of the compound. Higher molecular weights than 2000 g/mol, in contrast, may be disadvantageous since the sublimation temperature of the salt-type compound rises in a greater than proportional manner as a function of the increase in mass. In the course of processing, it has additionally been found that compounds having sublimation temperatures between greater than or equal to 120° C. and less than or equal to 600° C. can be deposited particularly homogeneously from the gas phase. This means that particularly homogeneous layers can be obtained. The molecular weights of the compounds can be calculated easily from the empirical formulae, and the sublimation temperatures are determined by the method known in the related art.

In a further preferred embodiment, the dopant used may be cesium pentacyanocyclopentadienide.

In a further aspect, the dopant may be present in the organic electron-conducting layer in a layer thickness concentration of greater than or equal to 0.01% and less than or equal to 50%. In addition, more preferably, the dopant may be present in the organic electron-conducting layer in a layer thickness concentration of greater than or equal to 1.0% and less than or equal to 10%. The layer thickness concentration describes the proportion by volume of the salt-type derivative in the overall electron-conducting layer. This proportion can be calculated, for example, using the cation distribution within the layer, which is determined, for example, by an energy-dispersive X-ray structure analysis (EDX) or AAS (atomic absorption spectroscopy). In the case that the dopants form charge transfer complexes, the layer thickness concentration can be determined by measurements of UV absorption.

The properties of an electron-conducting layer can be improved by the addition of a salt-type dopant. The dopant is capable of releasing an electron to the layer and can thus contribute to an increase in the conductivity of the layer. It has been found that, surprisingly, dopant layer thickness concentrations above and below the above-specified range can lead to poorer conductivities. Without being bound by the theory, lower dopant concentrations lead to inadequate electron injection into the conductive layer and higher dopant concentrations to a deficiency of electron transport components within the layer. In both cases, the conductivity of the electron-conducting layer may be insufficient for high-efficiency organic components.

In a further embodiment, the dopant may contain reactive substituents, which leads to a covalent bond between individual dopants in the electron-conducting layer via a cross-linking reaction after the application. The covalent bonds introduced additionally between the individual dopants can contribute to mechanical stabilization of the electron-conducting layer. The mechanical and thermal stability of the layer can be increased by the crosslinking and hence the lifetime of the component can be prolonged. The crosslinking of the individual dopants can be induced by an external trigger, for example UV light or, for example, by thermal irradiation. In the context of a solvent process, the cross-linking can be triggered, for example, by the removal of the solvent or chemical reaction initiators.

In addition, an organic electron-conducting layer can be produced by using a process wherein the organic electron-conducting layer is applied to a component by a solvent or sublimation process using salt-type cyclopentadiene compounds. More preferably, the electron-conducting region is produced by gas phase deposition, more preferably by physical gas phase deposition (PVD). In doing this, the dopant can preferably be deposited together with the electron-conducting layer. Both substances here may be sublimed from different sources using thermal energy. By this process, particularly homogeneous and uniform layers are obtained. Solvent processes can preferably be conducted in such a way that the components of the electron-conducting layer and the dopant are deposited onto a substrate from a solvent. This can simplify the process regime and enable more convenient production.

Moreover, the process for producing an organic electron-conducting layer can be employed for use in a organic solar cell, an organic transistor, a light-emitting organic component, an organic light-emitting diode and/or an organic light-emitting electrochemical cell. As a result of the improved electrical properties of the electrical transport layer, these layers are particularly suitable for formation of the abovementioned organic components.

In addition, it is possible by the process presented to produce an organic electronic component comprising an electron-conducting organic layer.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
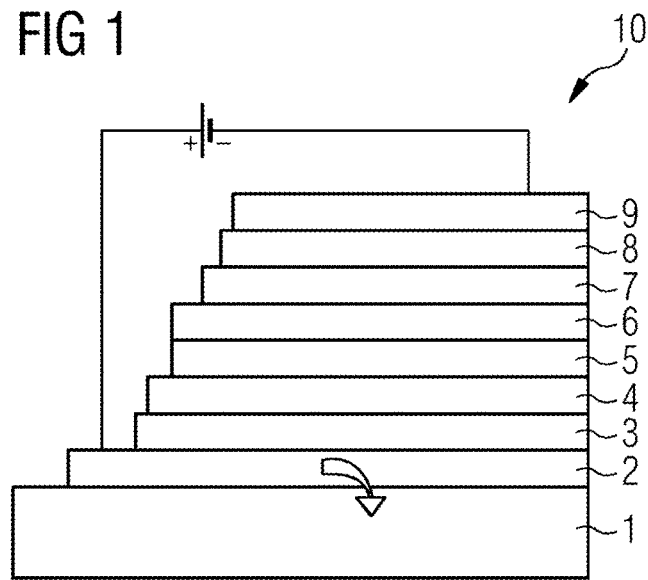
FIG. 1 shows a schematic of the structure of an organic light-emitting diode (10). The light-emitting diode is formed from a glass layer (1); indium tin oxide (ITO) layer (2); hole injector layer (3); hole transport layer (HTL) (4); emitter layer (EML) (5); hole blocker layer (HBL) (6); electron transport layer (ETL) (7); electron injector layer (8) and a cathode layer (9)
Figure 2:
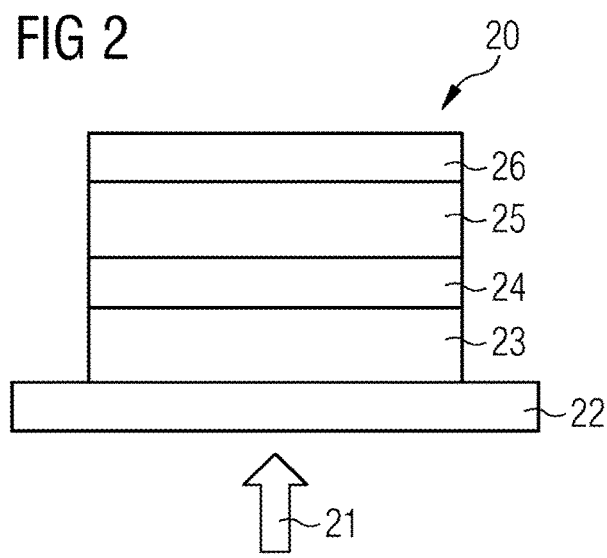
FIG. 2 shows a schematic of the structure of an organic solar cell having PIN structure (20), which converts light (21) to electrical current. The solar cell includes a layer of indium tin oxide (22); a p-doped layer (23); an absorption layer (24); an n-doped layer (25) and a metal layer (26)
Figure 3:
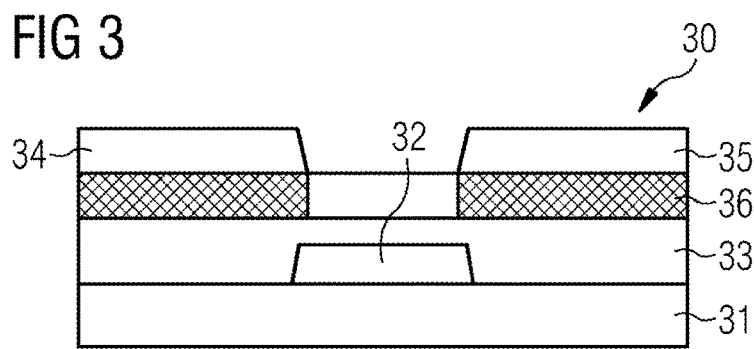
FIG. 3 shows a schematic of a possible cross section through an organic field-effect transistor (30). Applied to a substrate (31) are a gate electrode (32), a gate dielectric (33), a source and drain contact (34+35) and an organic semiconductor (36). The hatched areas show the areas where contact doping is helpful.

Reference will now be made in detail to the preferred embodiments of the present invention, examples of which are illustrated in the accompanying drawings, wherein like reference numerals refer to like elements throughout.

EXAMPLES

I. Synthesis of Pentaarylcyclopentadiene

The synthesis of pentaarylcyclopentadiene can be effected substantially by two different synthesis routes according to the following reaction schemes:

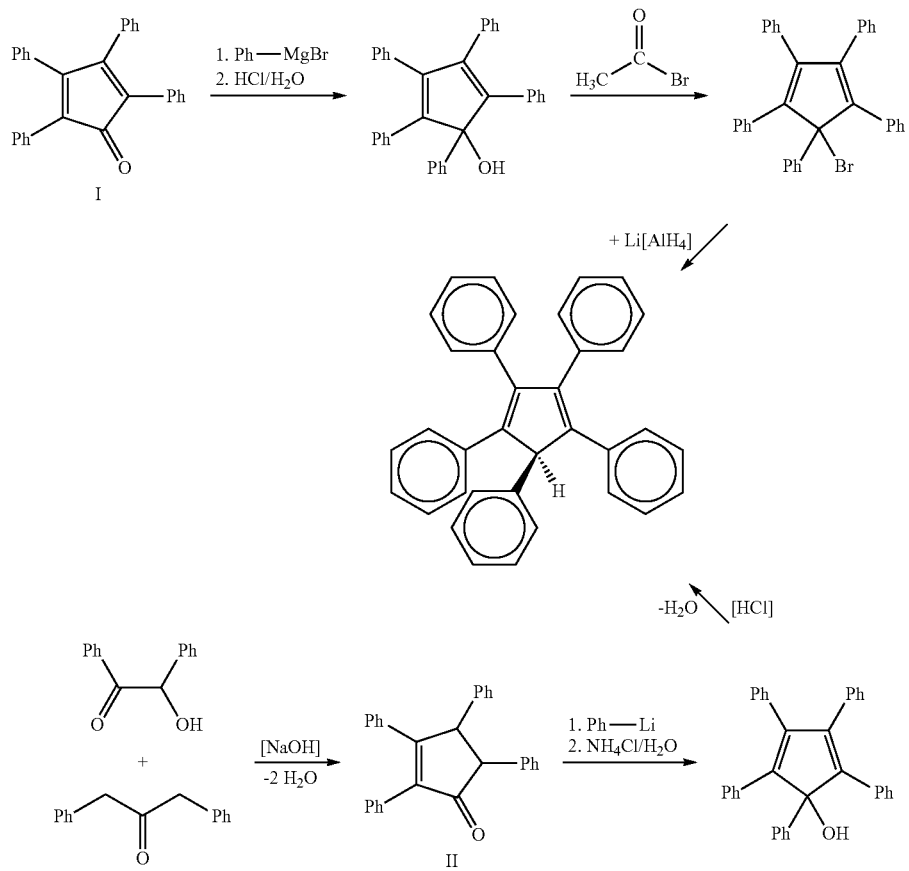

The first reaction pathway I is effected via tetraarylcyclopentadienone as starting substance, whereas the second reaction pathway II is effected via 2,3,4,5-tetraarylcyclopenten-2-one as starting substance.

I. Synthesis route proceeding from tetraarylcyclopentadienone The synthesis of pentaarylcyclopentadiene proceeding from tetraarylcyclopentadienone is based on the studies by Ziegler and Schnell (Ziegler et al., Liebigs Ann. Chem. 445 (1925), 266) and was modified in substantial processing.

Ia) 1,2,3,4,5-Pentaphenylcyclopenta-1,3-dien-5-ol

In a Grignard reaction, proceeding from tetraarylcyclopenta-dienone and an excess of arylmagnesium bromide, 1,2,3,4,5-pentaarylcyclopenta-1,3-dien-5-ol is obtained. In further processing, 1,2,3,4,5-pentaarylcyclopenta-1,3-dien-5-ol is obtained not as described in Ziegler by introducing a hydrogen bromide stream into a solution of the alcohol in glacial acetic acid, but by the reaction of the alcohol with acetyl bromide in toluene. This reaction proceeds particularly well with tertiary alcohols, for example triphenylmethanol.

46.2 g (0.12 mol) of tetraphenylcyclopentadienone are reacted with 0.61 mol of phenylmagnesium bromide in 400 ml of ether to give 1,2,3,4,5-pentaphenylcyclopenta-1,3-dienol (yield 50.8 g (87%); m.p.: 177-179° C., lit.: 175-176° C., elemental analysis for $C_{35}H_{26}O$. found: C, 90.98%; H, 5.59%; calc.: C, 90.88%; H, 5.66%.)

Ib) 5-Bromo-1,2,3,4,5-pentaphenylcyclopenta-1,3-diene

The pentaarylcyclopenta-1,3-dien-5-ol reacts with elimination of hydrogen bromide to give 1,2,3,4,5-pentaarylcyclopenta-1,3-diene 1-acetate. This ester is unstable in the presence of hydrogen bromide. With elimination of acetic acid, this gives a 1,2,3,4,5-pentaarylcyclopentadienyl cation, which is stabilized by accepting a bromide ion. With a reaction regime using an excess of acetyl bromide, the reaction proceeds quantitatively.

50.8 g (0.11 mol) of 1,2,3,4,5-pentaphenylcyclopenta-1,3-dien-5-ol are suspended in 200 ml of toluene. Within 20 minutes, 74 g (0.6 mol) of acetyl bromide are added dropwise at room temperature and then the reaction mixture is boiled under reflux for 2 hours. Towards the end of the reaction, another 2 ml of methanol are added dropwise. Excess acetyl bromide and toluene are distilled off under reduced pressure. The remaining oil crystallized after addition of 100 ml of petroleum ether. The orange precipitate is filtered off with suction, washed with petroleum ether and dried (m.p.: 183-185° C.). Analytically pure orange products are obtained by recrystallization from toluene. (Yield: 52.7 g (91%); m.p.: 189-190° C., lit.: 188-189° C.; elemental analysis for $C_{35}H_{25}Br$. found: C, 80.2%; H, 4.8%; calc.: C, 80.00%; H, 4.8%).

Ic) 1,2,3,4,5-Pentaphenylcyclopenta-1,3-diene

Subsequently, the 5-bromo-1,2,3,4,5-pentaarylcyclopenta-1,3-diene is reduced in ether with lithium aluminum hydride to give the pentaarylcyclopentadiene hydrocarbon (according to Houben-Weyl 4/1d Reduktion II, Methoden der organischen Chemie (1981) page 397).

Added in portions to a suspension of 11.5 g (0.3 mol) of Li in 150 ml of ether while stirring is a suspension of 52.6 g (0.1 mol) of 5-bromo-1,2,3,4,5-pentaphenylcyclopenta-1, 3-diene in 300 ml of ether. The resultant pale yellow-gray suspension is boiled under reflux for another 2 hours to complete the reduction. After cooling to room temperature, excess Li is hydrolyzed first with ice-water and then with dilute hydrochloric acid. The rotary evaporator is then used to distill all volatile organic constituents out of the reaction mixture. The pale yellow crude product is filtered off with suction and washed repeatedly with water. For further purification, it is dried azeotropically with toluene, filtered and then recrystallized (yield 37.3 g (84%); m.p.: 253-256° C. (according to the batch), lit.: 244-246; elemental analysis for C35H26. found: C, 94.8%; H, 5.8%; calc.: C, 94.13%; H, 5.87%; $^1$H NMR (200 MHz, CDCl3, TMS): δ 7.25-6.92 (multiplet, 25 aromatic H), 5.07 (1 acid H); $^{13}$C NMR (broadband-decoupled, 50 MHz, CDCl$_3$, TMS): 146.5, 144.0, 136.2, 135.8, 130.1, 129.0, 128.5, 128.4, 127.8, 127.6, 126.7, 126.5, 126.3, 62.7 (s, sp3-C); MS-EI spectrum corresponds to literature spectrum RMSD 5094-9).

II. Synthesis route proceeding from 2,3,4,5-tetraarylcyclo-penten-2-one

According to Dielthey et al. (Dielthey, W., Quint, F., J. Prakt. Chem. 2 (1930), 139), proceeding from benzoin and 1,3-diphenylacetone (dibenzyl ketone), 2,3,4,5-tetraarylcyclo-penten-2-one is obtained as the condensation product. 2,3,4,5-Tetraarylcyclopenten-2-one reacts with an excess of aryllithium to give 1,2,3,4,5-pentaarylcyclopenta-2,4-dien-1-ol, which is subsequently converted according to Rio et al. (Rio, G. Sanz, Bull. Soc. Chim. France 12 (1966) 3375) with elimination of water to give very pure pentaarylcyclopentadiene.

IIa. 1,2,3,4,5-Pentaphenylcyclopenta-1,3-diene 2,3,4,5-Tetraphenylcyclopenten-2-one reacts with an excess of phenyllithium to give 1,2,3,4,5-pentaphenylcyclopenta-2,4-dien-1-ol. 1,2,3,4,5-Pentaphenylcyclopenta-1,3-diene then forms through elimination of water. This method likewise gives very pure products.

1,2,3,4,5-Pentaphenylcyclopenta-1,3-diene is prepared from 37.8 g (0.098 mol) of 2,3,4,5-tetraphenylcyclopenten-2-one and 0.5 mol of phenyllithium (formed from 7 g (1 mol) of Li and 78.5 g (0.5 mol) of bromobenzene) in 300 ml of ether by a literature method of Rio and Sanz, and purified analogously to method I. The conversion of the 1,2,3,4,5-pentaphenylcyclo-penta-2,4-dien-1-ol to 1,2,3,4,5-pentaphenylcyclopenta-1,3-diene proceeds automatically within the conversion. This gives a yield of 34.9 g (80%), and the product is identical to the C$_5$HPh$_5$ prepared by method I.

III. Preparation of the Salts of the Cyclopentadiene Compounds Using the Example of the Cesium Salts About 100 mg of elemental cesium (Fluka) are washed repeatedly with hexane in order to remove any adhering oils. 1 mmol of the cyclopentadiene compounds is dried under reduced pressure and dissolved in about 20-40 ml of THF. This solution was added to the purified cesium. There is evolution of hydrogen. The suspension is stirred (about 2-4 h) until coloring occurs or no further evolution of hydrogen is observed. The solution is filtered to remove excess cesium. By drawing off the solvent and subsequent sharp drying, the anhydrous cesium salts of the cyclopentadiene compound are obtained.

IV. Production of the Layers

IV.1) Production of the Comparative Material

Deposited on an ITO (indium tin oxide=indium-doped tin oxide) electrode by thermal evaporation is a 200 nm-thick layer of the electron conductor BCP (2,9-dimethyl-4,7-diphenyl-1,10-phenanthroline). The counterelectrode used is a 150 nm-thick aluminum layer.

IV.2) Production of Organic Electrically Conductive Layers with Cesium Pentaphenylcyclopentadienide as Dopant In three further experiments, a cesium pentaphenylcyclopenta-dienide is incorporated into the electrically conductive layer by doping in concentrations of 2%, 5% and 10% relative to the evaporation rate of the BCP.

In the course of a physical characterization, it is found for the current-voltage characteristics of the doped organic components that the current density of the doped layers is well above that of the comparative substrate at the same voltage. When the level of doping is sufficiently small, this effect is nearly proportional to the doping intensity. Increasing current density therefore leads to the conclusion of an increase in the charge carrier density and/or mobility.

IV.3 Production of Organic Electrically Conductive Layers with Rubidium Penta(p-Tolyl)Cyclopentadienide as Dopant In three further experiments, a rubidium penta(p-tolyl) cyclo-pentadienide is incorporated by doping in concentrations of 2%, 5% and 10% relative to the evaporation rate of BCP.

In the course of a physical characterization, it is found for the current-voltage characteristics of the doped organic components that the current density of the doped layers is well above that of the comparative substrate at the same voltage. When the level of doping is sufficiently small, this effect is nearly proportional to the doping intensity. Increasing current density therefore leads to the conclusion of an increase in the charge carrier density and/or mobility.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV*, 69 USPQ2d 1865 (Fed. Cir. 2004).

The invention claimed is:
1. An organic electron-conducting layer, comprising:
   at least one dopant to increase the n-conductivity of the organic electron-conducting layer, wherein the at least one dopant is selected from the group consisting of salts of cyclopentadiene compounds of the following formula:

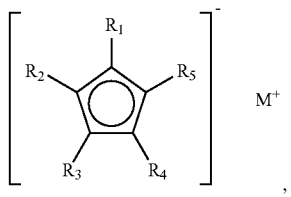

where
- $M^+$ is an alkali metal, and
- the substituents $R_1$ to $R_5$ are each independently selected from the group consisting of —H, deuterium, halogens, —CN, —NO$_2$, —OH, amines, ethers, thioethers, alkyls, cycloalkyls, acryloyls, vinyls, allyls, aromatics, fused aromatics and heteroaromatics, and
- the salts of the cyclopentadiene compounds have sublimation temperatures that are greater than or equal to 120° C. and less than or equal to 600° C.

2. The organic electron-conducting layer as claimed in claim 1, wherein the at least one dopant is selected from the group consisting of unsubstituted and substituted pentaarylcyclopentadiene salts.

3. The organic electron-conducting layer as claimed in claim 1, wherein $M^+$ is an alkali metal cation selected from the group consisting of lithium, sodium, potassium, rubidium and cesium.

4. The organic electron-conducting layer as claimed in claim 1, wherein $M^+$ is a heavy alkali metal cation selected from the group consisting of rubidium and cesium.

5. The organic electron-conducting layer as claimed in claim 1, wherein an organic portion of the at least one dopant has an oxidation number of greater than or equal to −1 and less than or equal to 0.

6. The organic electron-conducting layer as claimed in claim 1, wherein the organic electron-conducting layer is applicable to an organic electronic component by a solvent or sublimation process.

7. The organic electron-conducting layer as claimed in claim 1, wherein a molecular weight of the salts of the cyclopentadiene compounds is greater than or equal to 175 g/mol and less than or equal to 2000 g/mol.

8. The organic electron-conducting layer as claimed in claim 1, wherein the at least one dopant is present in the organic electron-conducting layer in a layer thickness concentration of greater than or equal to 0.01% and less than or equal to 50%.

9. An organic electron-conducting layer, comprising:
at least one dopant to increase the n-conductivity of the organic electron-conducting layer, wherein the at least one dopant is selected from the group consisting of salts of cyclopentadiene compounds of the following formula:

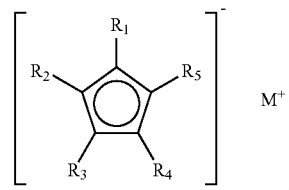

wherein:
- $M^+$ is an alkali metal;
- the substituents $R_1$ to $R_5$ are each independently selected from the group consisting of —H, deuterium, halogens, —CN, -NO$_2$, —OH, amines, ethers, thioethers, alkyls, cycloalkyls, acryloyls, vinyls, allyls, aromatics, fused aromatics and heteroaromatics; and
- the at least one dopant is present in the organic electron-conducting layer in a layer thickness concentration of greater than or equal to 0.01% and less than or equal to 50%.

10. An organic electron-conducting layer, comprising:
at least one dopant to increase the n-conductivity of the organic electron-conducting layer, wherein the at least one dopant is selected from the group consisting of salts of cyclopentadiene compounds of the following formula:

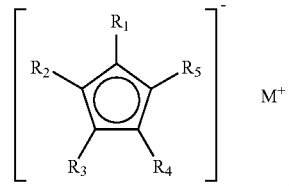

- $M^+$ is an alkali metal;
- the substituents $R_1$ to $R_5$ are each independently selected from the group consisting of —H, deuterium, halogens, —CN, —NO$_2$, —OH, amines, ethers, thioethers, alkyls, cycloalkyls, acryloyls, vinyls, allyls, aromatics, fused aromatics and heteroaromatics; and
- the at least one dopant is present in the organic electron-conducting layer in a layer thickness concentration of greater than or equal to 1.0% and less than or equal to 10%.

* * * * *